(12) United States Patent
Fukuda et al.

(10) Patent No.: US 8,125,002 B2
(45) Date of Patent: Feb. 28, 2012

(54) SEMICONDUCTOR DEVICE AND INVERTER CIRCUIT HAVING THE SAME

(75) Inventors: Yutaka Fukuda, Kariya (JP); Yukio Tsuzuki, Nukata-gun (JP)

(73) Assignee: DENSO Corporation, Kariya (JP)

( * ) Notice: Subject to any disclaimer, the term of this patent is extended or adjusted under 35 U.S.C. 154(b) by 287 days.

(21) Appl. No.: 12/289,852

(22) Filed: Nov. 6, 2008

(65) Prior Publication Data

US 2009/0114947 A1 May 7, 2009

(30) Foreign Application Priority Data

Nov. 7, 2007 (JP) ................................. 2007-290062
Jul. 17, 2008 (JP) ................................. 2008-186427

(51) Int. Cl.
*H01L 29/43* (2006.01)
*H01L 29/45* (2006.01)

(52) U.S. Cl. .................... 257/140; 257/146; 257/378

(58) Field of Classification Search .................. 257/140, 257/146, 162, 350, 378, 477, 517, 526, E27.017, 257/E27.018, E27.023
See application file for complete search history.

(56) References Cited

U.S. PATENT DOCUMENTS

| 5,432,471 | A | 7/1995 | Majumdar et al. |
| 7,235,857 | B2 | 6/2007 | Majumdar et al. |
| 2005/0258493 | A1 | 11/2005 | Aono et al. |
| 2006/0172494 | A1 | 8/2006 | Kohlmann-Von Platen et al. |
| 2007/0108468 | A1 | 5/2007 | Takahashi |
| 2007/0170549 | A1 | 7/2007 | Tsuzuki et al. |

FOREIGN PATENT DOCUMENTS

| JP | A-09-064707 | 3/1997 |
| JP | B2-3339311 | 2/1998 |
| JP | A-10-145206 | 5/1998 |
| JP | A-2008-300627 | 12/2008 |

OTHER PUBLICATIONS

U.S. Appl. No. 12/289,773, filed Nov. 4, 2008, Sumitomo et al.
Office Action mailed May 6, 2010 issued from the Japan Patent Office in the corresponding patent application No. 2008-186427 (and English translation).
U.S. Appl. No. 12/230,794, filed Sep. 4, 2008, Kouno.

*Primary Examiner* — Hung Vu
(74) *Attorney, Agent, or Firm* — Posz Law Group, PLC

(57) ABSTRACT

A semiconductor device includes a semiconductor substrate, an insulated gate transistor formed to the semiconductor substrate, a diode formed to the semiconductor substrate, and a control transistor formed to the semiconductor substrate. A first current terminal of the insulated gate transistor is coupled to a cathode of the diode at a high potential side. A second current terminal of the insulated gate transistor is coupled to an anode of the diode at a low potential side. The control transistor is configured to turn off the insulated gate transistor by reducing a potential of a gate terminal of the insulated gate transistor when the diode conducts an electric current.

16 Claims, 17 Drawing Sheets

US 8,125,002 B2

SEMICONDUCTOR DEVICE AND INVERTER CIRCUIT HAVING THE SAME

CROSS REFERENCE TO RELATED APPLICATION

This application is based on and incorporates herein by reference Japanese Patent Applications No. 2007-290062 filed on Nov. 7, 2007 and No. 2008-186427 filed on Jul. 17, 2008.

FIELD OF THE INVENTION

The present invention relates to a semiconductor device constructed with an insulated gate transistor and an anti-parallel diode that are formed in a common semiconductor substrate. The present invention also relates to an inverter circuit constructed with the semiconductor device.

BACKGROUND OF THE INVENTION

A semiconductor device constructed with an insulated gate transistor and an anti-parallel diode that are formed in a common semiconductor substrate is disclosed, for example, in US 2005/0258493 corresponding to Japanese Patent Publication No. 2005-317751, US 2007/0108468 corresponding to Japanese Patent Publication No. 2007-134625, and US 2007/0170549 corresponding to Japanese Patent Publication No. 2007-214541.

FIG. 19 illustrates a semiconductor device 100 disclosed in US 2007/0170549. In the semiconductor device 100, an insulated gate bipolar transistor (IGBT) cell 100i and a diode cell 100d are formed in a common semiconductor substrate 1. A first electrode layer 8 made of polysilicon is formed in a first trench T1 through an insulation film 7. The first electrode layer 8 serves as a gate electrode of the IGBT cell 100i. A second electrode layer 10 made of aluminum is formed on a first side of the semiconductor substrate 1. A second trench T2 is filled with the second electrode layer 10. The second electrode layer 10 penetrates through a first side N-type region 3a and a first side P-type region 4a so that the first side N-type region 3a and the first side P-type region 4a can be electrically coupled. Further, the second electrode layer 10 is electrically coupled to a P-type layer 2a. The second electrode layer 10 serves as an emitter electrode of the IGBT cell 100i and an anode electrode of the diode cell 100d. A second side P+-type region 5 and a second side N+-type region 6 are formed to a surface portion of a second side of the semiconductor substrate 1. A third electrode layer 11 is formed on the second side of the semiconductor substrate 1 and electrically coupled to each of the second side P+-type region 5 and the second side N+-type region 6. Thus, the second side P+-type region 5 and the second side N+-type region 6 are electrically coupled by the third electrode layer 11. The third electrode layer 11 serves as a collector electrode of the IGBT cell 100i and a cathode electrode of the diode cell 100d.

That is, in the semiconductor device 100, an insulated gate transistor and a diode are coupled together in an antiparallel configuration. A first terminal (e.g., collector) of the insulated gate transistor and a cathode of the diode are coupled together at a high potential side, and a second terminal (e.g., emitter) of the insulated gate transistor and an anode of the diode are coupled together at a low potential side. Such a semiconductor device as the semiconductor device 100 is usually integrated in an inverter circuit to control an electrical load by a pulse width modulation (PWM) technique.

Generally, when such a semiconductor device as the semiconductor device 100 is used in an inverter circuit, a gate signal applied to an IGBT of an upper half of the inverter circuit is opposite in phase with a gate signal applied to an IGBT of a lower half of the inverter circuit. Therefore, the gate signal may be applied to the IGBT even during a freewheel operation of a diode coupled to the IGBT in an anti-parallel configuration. That is, there may be a period of time when the IGBT and the diode operate at the same time. As described above, in the semiconductor device 100, the collector of the IGBT and the cathode of the diode are coupled together, and the emitter of the IGBT and the anode of the diode are coupled together. Therefore, when the IGBT is turned on, the cathode and anode of the diode try to be at the same potential. As a result, a forward bias voltage of the diode rises, and a forward loss of the diode increases accordingly. In this way, in the semiconductor device 100 shown in FIG. 19, the forward loss of the diode may be increased due to the fact that the IGBT and the diode interfere with each other.

The present inventor has studied a semiconductor device 90 illustrated in FIG. 20 (Japanese Patent Application No. 2007-229959). The semiconductor device 90 is configured to avoid interference between an IGBT and a diode so that an increase in a forward loss of the diode can be prevented.

As shown in FIG. 20, the semiconductor device 90 includes an AND circuit 50, an IGBT 20 with a built-in diode, a sensing resistor 30, and a feedback circuit 40.

The AND circuit 50 is a logic gate that produces a high level output only when all inputs are high level. A PWM gate signal for driving the IGBT 20 is inputted to the AND circuit 50 from an external circuit. Further, an output of the feedback circuit 40 is inputted to the AND circuit 50.

The IGBT 20 includes an IGBT section 21 and a diode section 22. The IGBT section 21 and the diode section 22 are formed in a common semiconductor substrate. The IGBT section 21 includes a primary IGBT 21a coupled to an electrical load and a secondary IGBT 21b for detecting an electric current flowing through the primary IGBT 21a. Voltages applied to the gates of the IGBTs 21a, 21b are controlled by the PWM gate signal outputted from the AND circuit 50. An emitter of the secondary IGBT 21b is coupled to a first end of the sensing resistor 30, and a voltage drop Vs across the sensing resistor 30 is fedback to the feedback circuit 40. The diode section 22 is configured to commutate a load current flowing through the IGBT 21a. The diode section 22 includes a primary diode 22a coupled to the primary IGBT 21a and a secondary diode 22b for detecting an electric current flowing through the primary diode 22a. An anode of the secondary diode 22b is coupled to the first end of the sensing resistor 30.

The feedback circuit 40 determines whether the electric current flows through the primary diode 22a and also determines whether an excessive current flows through the IGBT 21a. Based on results of the determinations, the feedback circuit 40 allows or prevents the PWM gate signal to pass through the AND circuit 50. Specifically, when the primary IGBT 21a is driven, the feedback circuit 40 outputs to the AND circuit 50 a signal that allows the PWM gate signal to pass through the AND circuit 50. However, if voltage drop Vs across the sensing resistor 30 is less than a diode current detection threshold Vth1 or greater than a excessive current detection threshold Vth2, the feedback circuit 40 outputs to the AND circuit 50 a signal that prevents the PWM gate signal to pass through the AND circuit 50.

Thus, in the semiconductor device 90 illustrated in FIG. 20, the primary diode 22a conducts the electric current in the forward direction without interfering with the primary IGBT 21a. Therefore, an increase in a forward voltage of the primary diode 22a is avoided, and an increase in a forward loss of the primary diode 22a can be prevented accordingly.

Further, if the excessive current flows through the primary IGBT 21a, the feedback circuit 40 outputs to the AND circuit 50 the signal that prevents the PWM gate signal to pass through the AND circuit 50. Thus, the IGBT 21a can be protected from the excessive current.

SUMMARY OF THE INVENTION

It is an object of the present invention to provide a semiconductor device constructed with an insulated gate transistor and an anti-parallel diode that are formed in a common semiconductor substrate. The semiconductor device has a control transistor capable of operating at high speed to surely prevent an increase in a forward loss of the diode and to surely protect the insulated gate transistor from an excessive current. It is another object of the present invention to provide an inverter circuit constructed with the semiconductor device.

According to an aspect of the present invention, a semiconductor device includes a semiconductor substrate, an insulated gate transistor formed to the semiconductor substrate, a diode formed to the semiconductor substrate, and a control transistor formed to the semiconductor substrate. A first current terminal of the insulated gate transistor is coupled to a cathode of the diode at a high potential side. A second current terminal of the insulated gate transistor is coupled to an anode of the diode at a low potential side. The control transistor is configured to turn off the insulated gate transistor by reducing a potential of a gate terminal of the insulated gate transistor when the diode conducts an electric current.

According to another aspect of the present invention, an inverter circuit includes semiconductor devices, each of which includes a semiconductor substrate, an insulated gate transistor formed to the semiconductor substrate, a diode formed to the semiconductor substrate, and a control transistor formed to the semiconductor substrate. A first current terminal of the insulated gate transistor is coupled to a cathode of the diode at a high potential side. A second current terminal of the insulated gate transistor is coupled to an anode of the diode at a low potential side. The control transistor is configured to turn off the insulated gate transistor by reducing a potential of a gate terminal of the insulated gate transistor when the diode conducts an electric current.

BRIEF DESCRIPTION OF THE DRAWINGS

The above and other objectives, features and advantages of the present invention will become more apparent from the following detailed description made with check to the accompanying drawings. In the drawings.

DETAILED DESCRIPTION OF THE PREFERRED EMBODIMENTS

First Embodiment

Figure 1:
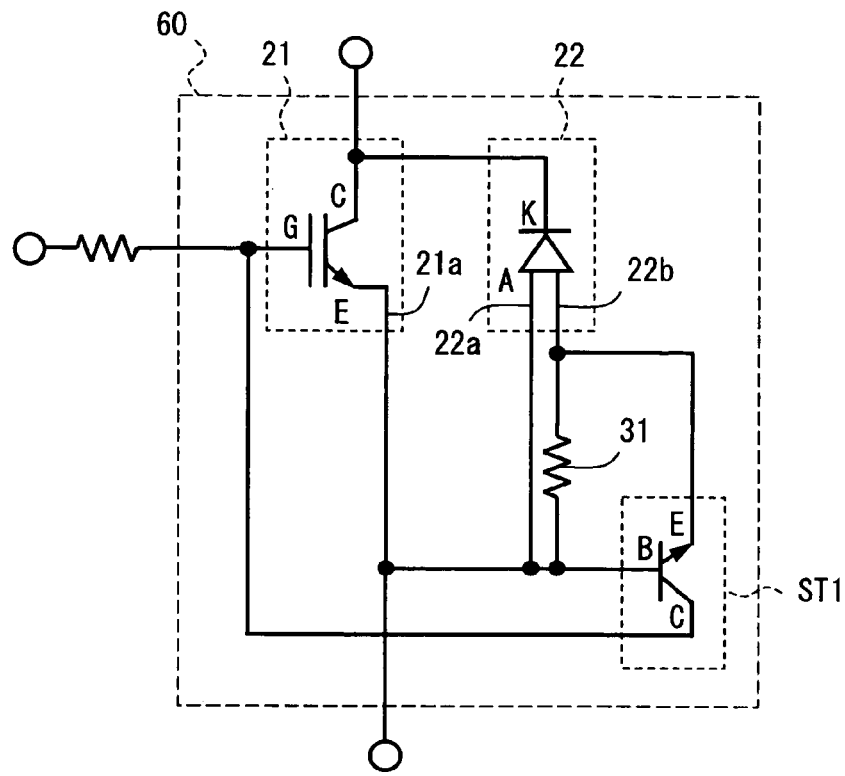
FIG. 1 is a diagram illustrating an equivalent circuit of a semiconductor device according to a first embodiment of the present invention.

FIG. 1 is a diagram illustrating an equivalent circuit of a semiconductor device 60 according to a first embodiment of the present invention.

Figure 19:
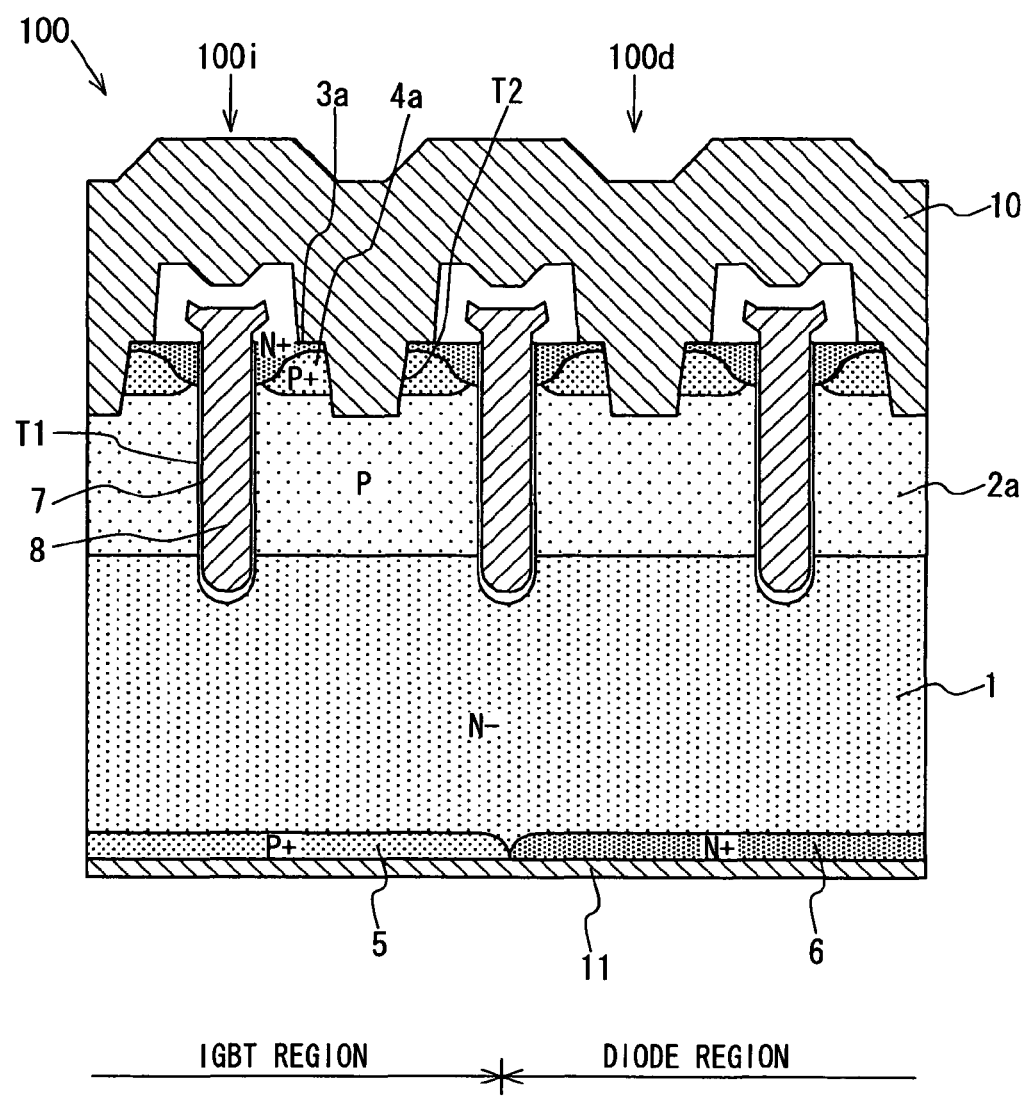
FIG. 19 is a diagram illustrating a semiconductor device according to a prior art.

For example, the semiconductor device 60 can be integrated in an inverter circuit that controls an electrical load by a pulse width modulation (PWM) technique. The semiconductor device 60 includes an insulated gate bipolar transistor (IGBT) 21 and a diode 22. The IGBT 21 and the diode 22 are formed in a common semiconductor substrate and coupled in an antiparallel configuration. Specifically, a collector terminal (as a first current terminal) of the IGBT 21 and a cathode terminal of the diode 22 are coupled together at a high potential side. An emitter terminal 21a (as a second current terminal) of the IGBT 21 and an anode terminal 22a of the diode 22 are coupled together at a low potential side. For example, the IGBT 21 and the diode 22 can have the same structure as shown in FIG. 19.

The semiconductor device 60 further includes a bipolar transistor ST1 (as a first control transistor). The bipolar transistor ST1 is formed in the common semiconductor substrate, where the IGBT 21 and the diode 22 are formed. The bipolar transistor ST1 is located adjacent to the IGBT 21 or the diode 22 to improve responsivity by reducing the wiring length. The diode 22 has a sensing anode terminal 22b for outputting an electric current proportional to an electric current flowing through the diode 22. A first sensing resistor 31 is coupled between the anode terminal 22a and the sensing anode terminal 22b of the diode 22. A base terminal (as a control terminal) of the bipolar transistor ST1 is coupled to the anode terminal 22a of the diode 22. A collector terminal (as a first current terminal) of the bipolar transistor ST1 is coupled to the gate terminal of the IGBT 21. An emitter terminal (as a second current terminal) of the bipolar transistor ST1 is coupled to the sensing anode terminal 22b of the diode 22. The first sensing resistor 31 can be, for example, a thin film resistor, a diffused resistor, or the like. The first sensing resistor 31 is formed in the common semiconductor substrate, where the IGBT 21 and the diode 22 are formed.

As described above, the bipolar transistor ST1 is located adjacent to the IGBT 21 or the diode 22 to reduce the wiring length. In such an approach, the wiring inductance and capacitance are reduced so that the bipolar transistor ST1 can operate at high speed. Further, manufacturing cost of the semiconductor device 60 can be reduced. For example, when the semiconductor device 60 is integrated in an inverter circuit that controls an inductive load such as a motor, the semiconductor device 60 can handle instantaneous large currents such as a inrush current and a flyback current in the following manner.

In the semiconductor device 60, when the diode 22 conducts a forward current, the bipolar transistor ST1 reduces a potential of the gate terminal of the IGBT 21 so that the IGBT 21 can be tuned off. Specifically, when the forward current flows through the diode 22, an electric current proportional to the forward current flows through the sensing anode terminal 22b and the first sensing resistor 31. Then, a voltage drop across the first sensing resistor 31 is applied between the base and emitter terminals of the bipolar transistor ST1, so that the bipolar transistor ST1 can be turned on. Consequently, the potential of the gate terminal of the IGBT 21 is reduced to near a potential of the emitter terminal 21a of the IGBT 21. Thus, the IGBT 21 is turned off.

Figure 20:
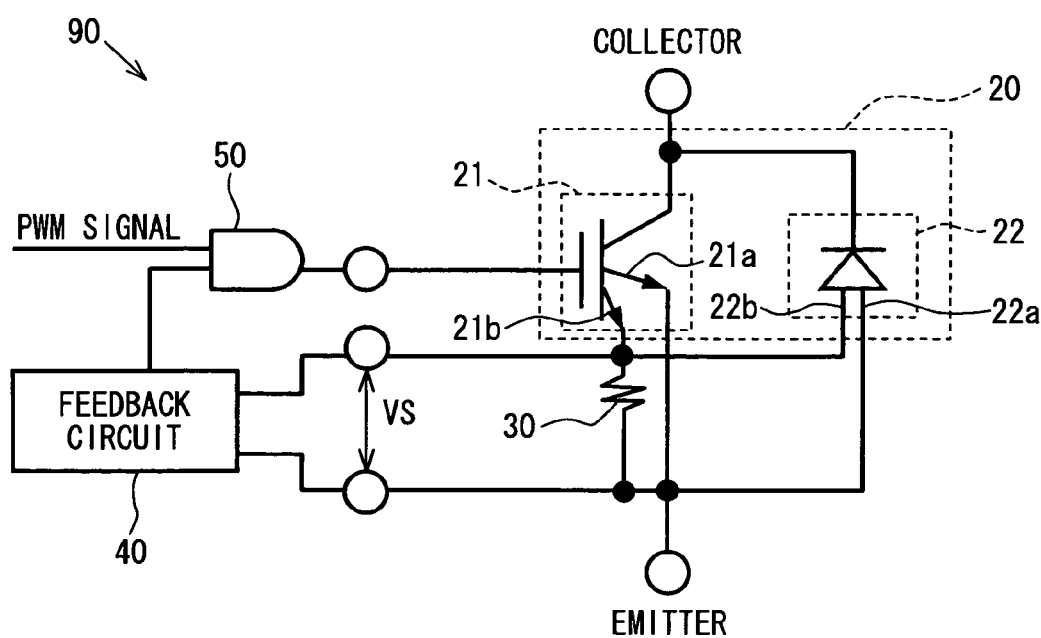
FIG. 20 is a diagram illustrating a semiconductor device according to a related art.

In summary, when the forward current flows through the diode 22, the bipolar transistor ST1 causes the IGBT 21 to be turned off. That is, the bipolar transistor ST1 of the semiconductor device 60 can operate in the same manner as the feedback circuit 40 of the semiconductor device 90 of FIG. 20 to prevent interference between the IGBT 21 and the diode 22.

As described above, according to the first embodiment, the semiconductor device 60 includes the bipolar transistor ST1 that can serve as the feedback circuit 40 to prevent interference between the IGBT 21 and the diode 22. Therefore, the diode 22 conducts the electric current in the forward direction without interfering with the IGBT 21 so that an increase in a forward voltage of the diode 22 can be avoided. Accordingly, an increase in a forward loss of the diode 22 can be prevented.

As compared to the feedback circuit 40, the bipolar transistor ST1 can have a simple structure and a small size. Accordingly, the semiconductor device 60 can be reduced in size. Further, since the bipolar transistor ST1 is located adjacent to the IGBT 21 or the diode 22 to reduce the wiring length, the bipolar transistor ST1 can operate at high speed to handle the instantaneous large currents. Therefore, it can be ensured that the bipolar transistor ST1 can prevent the increase in the forward loss of the diode 22.

Second Embodiment

Figure 2:
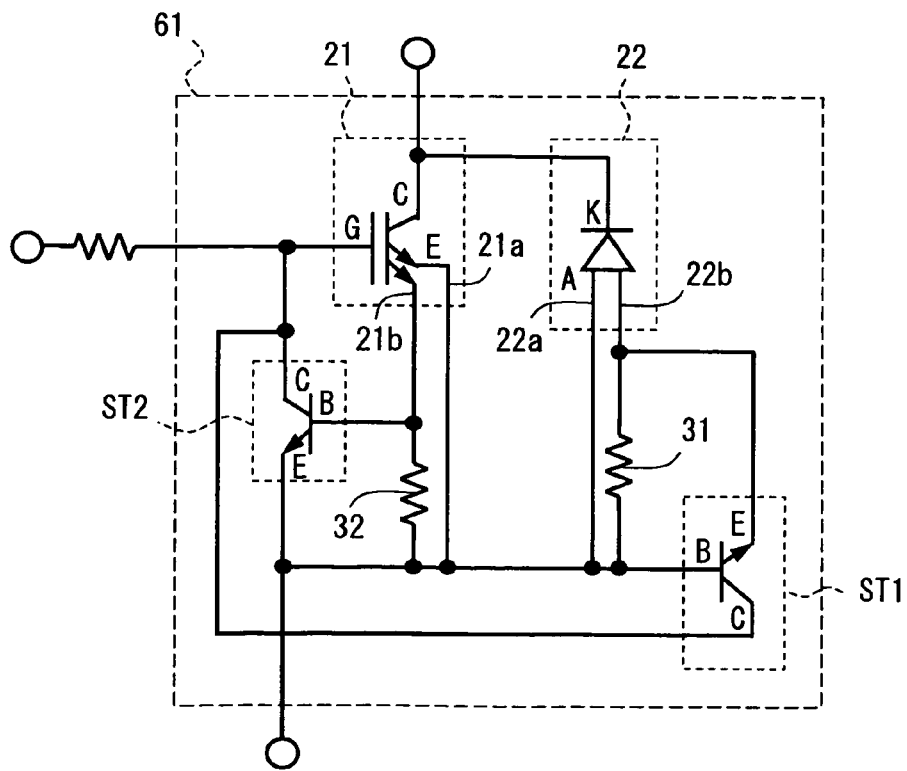
FIG. 2 is a diagram illustrating an equivalent circuit of a semiconductor device according to a second embodiment of the present invention.

FIG. 2 is a diagram illustrating an equivalent circuit of a semiconductor device 61 according to a second embodiment of the present invention. Differences between the first and second embodiments are as follows.

The semiconductor device 61 includes a bipolar transistor ST2 (as a second control transistor) in addition to the bipolar transistor ST1. Like the bipolar transistor ST1, the bipolar transistor ST2 is formed in the common semiconductor substrate, where the IGBT 21 and the diode 22 are formed. The bipolar transistor ST2 is located adjacent to the IGBT 21 or the diode 22 to improve responsivity by reducing the wiring length.

In the semiconductor device 61, the IGBT 21 has an additional sensing emitter terminal 21b for outputting an electric current proportional to an electric current flowing through the IGBT 21. A second sensing resistor 32 is coupled between the emitter terminal 21a and the sensing emitter terminal 21b of the IGBT 21. A base terminal (as a control terminal) of the bipolar transistor ST2 is coupled to the sensing emitter terminal 21b of the IGBT 21. A collector terminal (as a first current terminal) of the bipolar transistor ST2 is coupled to the gate terminal of the IGBT 21. An emitter terminal (as a second current terminal) of the bipolar transistor ST2 is coupled to the emitter terminal 21a of the IGBT 21. The second sensing resistor 32 can be, for example, a thin film resistor, a diffused resistor, or the like. The second sensing resistor 32 is formed in the common semiconductor substrate, where the IGBT 21 and the diode 22 are formed.

In the semiconductor device 61, when an excessive current flows through the IGBT 21, the bipolar transistor ST2 reduces a potential of the gate terminal of the IGBT 21 so that the IGBT 21 can be tuned off. Specifically, when the excessive current flows through the IGBT 21, an electric current proportional to the excessive current flows through the sensing emitter terminal 21b and the second sensing resistor 32. Then, a voltage drop across the second sensing resistor 32 is applied between the base and emitter terminals of the bipolar transistor ST2, so that the bipolar transistor ST2 can be turned on. Consequently, the potential of the gate terminal of the IGBT 21 is reduced to near a potential of the emitter terminal 21a of the IGBT 21. Thus, the IGBT 21 is turned off.

In summary, when the excessive current flows through the IGBT 21, the bipolar transistor ST2 causes the IGBT 21 to be turned off. That is, the bipolar transistor ST2 of the semiconductor device 60 can operate in the same manner as the feedback circuit 40 of the semiconductor device 90 of FIG. 20 to protect the IGBT 21 from the excessive current.

As described above, according to the second embodiment, the semiconductor device 61 includes the bipolar transistor ST2 that can serve as the feedback circuit 40 to protect the excessive current from the IGBT 21. As compared to the feedback circuit 40, the bipolar transistor ST2 can have a simple structure and a small size. Accordingly, the semiconductor device 61 can be reduced in size. Further, since the bipolar transistor ST2 is located adjacent to the IGBT 21 or the diode 22 to reduce the wiring length, the bipolar transistor ST2 can operate at high speed to handle the excessive current. Therefore, it can be ensured that the bipolar transistor ST2 can protect the IGBT 21 from the excessive current.

Third Embodiment

Figure 3:
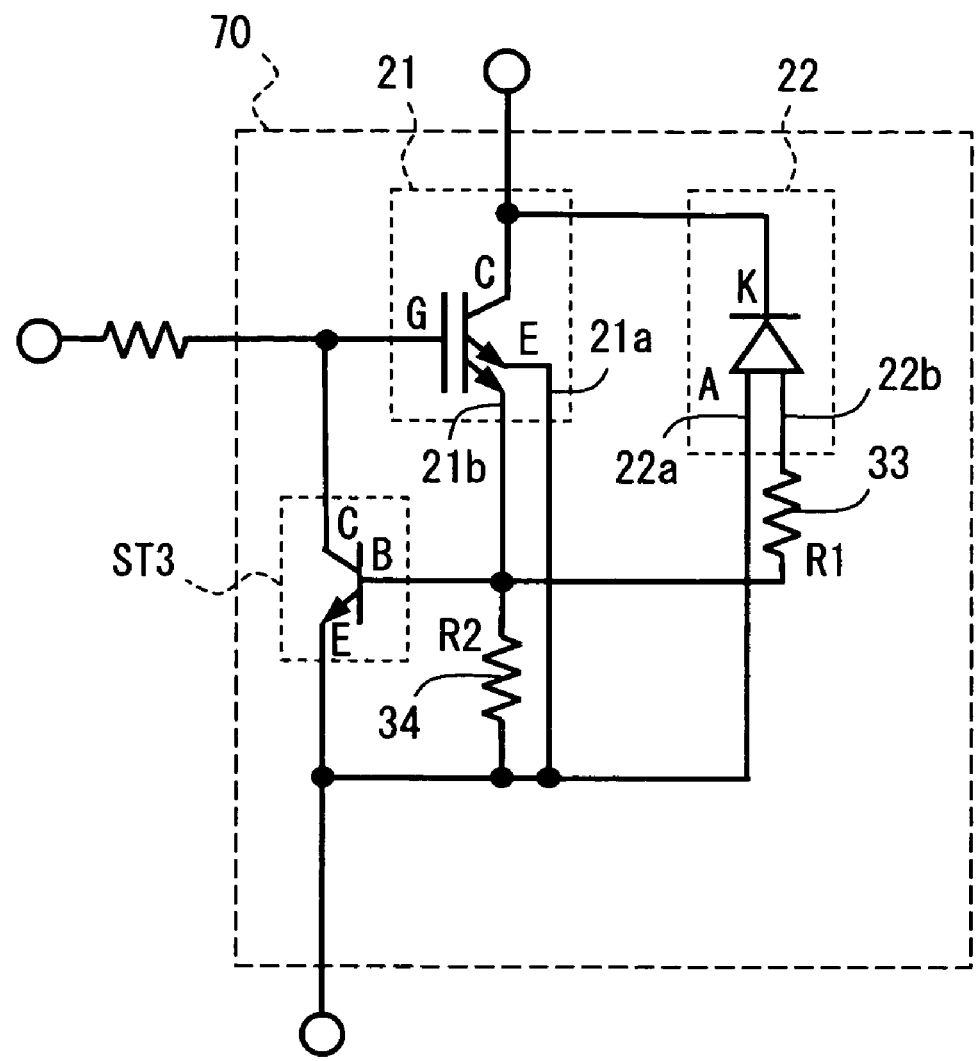
FIG. 3 is a diagram illustrating an equivalent circuit of a semiconductor device according to a third embodiment of the present invention.

FIG. 3 is a diagram illustrating an equivalent circuit of a semiconductor device 70 according to a third embodiment of the present invention. Differences between the preceding embodiments and the third embodiment are as follows.

The semiconductor device 70 includes a bipolar transistor ST3 in addition to the IGBT 21 and the diode 22. The bipolar transistor ST3 is formed in the common semiconductor substrate, where the IGBT 21 and the diode 22 are formed. The bipolar transistor ST3 is located adjacent to the IGBT 21 or the diode 22 to improve responsivity by reducing the wiring length. The diode 22 has the sensing anode terminal 22b, and the IGBT 21 has the sensing emitter terminal 21b. A first sensing resistor 33 is coupled between the sensing anode terminal 22b of the diode 22 and the sensing emitter terminal 21b of the IGBT 21. A second sensing resistor 34 is coupled between the emitter terminal 21a and the sensing emitter terminal 21b of the IGBT 21. The first and second sensing resistors 33, 34 have resistances R1, R2, respectively. The resistance R1 of the first sensing resistor 33 is greater than the second sensing resistance R2 of the second resistor 34. Each of the first and second sensing resistors 33, 34 can be, for example, a thin film resistor, a diffused resistor, or the like. Each of the first and second sensing resistors 33, 34 is formed in the common semiconductor substrate, where the IGBT 21 and the diode 22 are formed.

A base terminal (as a control terminal) of the bipolar transistor ST3 is coupled to the sensing emitter terminal 21b of the IGBT 21. A collector terminal (as a first current terminal) of the bipolar transistor ST3 is coupled to the gate terminal of the IGBT 21. An emitter terminal (as a second current terminal) of the bipolar transistor ST3 is coupled to the anode terminal 22a of the diode 22.

In the semiconductor device 70, when the diode 22 conducts a forward current, an electric current proportional to the forward current flows through the sensing anode terminal 22b and the first and second sensing resistors 33, 34. Since the resistance R1 of the first resistor 33 is greater than the resistance R2 of the second resistor 34, the bipolar transistor ST3 operates as a reverse transistor and is turned on. Consequently, a potential of the gate terminal of the IGBT 21 is reduced to near a potential of the emitter terminal 21a of the IGBT 21. Thus, the IGBT 21 is turned off so that an increase in a forward loss of the diode 22 can be prevented.

Further, in the semiconductor device 70, when an excessive current flows through the IGBT 21, an electric current proportional to the excessive current flows through the sensing emitter terminal 21b and the second sensing resistor 34. Then, a voltage drop across the second sensing resistor 34 is applied between the base and emitter terminals of the bipolar transistor ST3, so that the bipolar transistor ST3 can be turned on. Consequently, the potential of the gate terminal of the IGBT 21 is reduced to near a potential of the emitter terminal 21a of the IGBT 21. Thus, the IGBT 21 is turned off and protected from the excessive current.

(Modifications)

The embodiments described above can be modified in various ways. Although the IGBT 21 is used as an insulated gate transistor in the semiconductor devices 60, 61, 70, the insulated gate transistor can be a transistor other than an IGBT. For example, a vertical MOSFET can be used as the insulated gate transistor. In this case, a drain terminal of the vertical MOSFET corresponds to the collector terminal of the IGBT 21, and a source terminal of the vertical MOSFET corresponds to the emitter terminal 21a of the IGBT 21.

Although the bipolar transistors ST1-ST3 are used as a control transistor in the semiconductor devices 60, 61, 70, the control transistor can be a transistor other than a bipolar transistor. For example, a MOSFET can be used as the control transistor. In this case, a gate terminal of the MOSFET corresponds to the base terminal of each of the bipolar transistors ST1-ST3, a drain terminal of the MOSFET corresponds to the collector terminal of each of the bipolar transistors ST1-ST3, and a source terminal of the MOSFET corresponds to the emitter terminal of each of the bipolar transistors ST1-ST3.

Examples of a structure of the semiconductor device 61 shown in FIG. 2 are described below with reference to FIGS. 4A-7. Although not shown in the drawings, the semiconductor devices 60, 70 shown in FIGS. 1, 3 can have a similar structure to the semiconductor device 61.

Figure 4A:
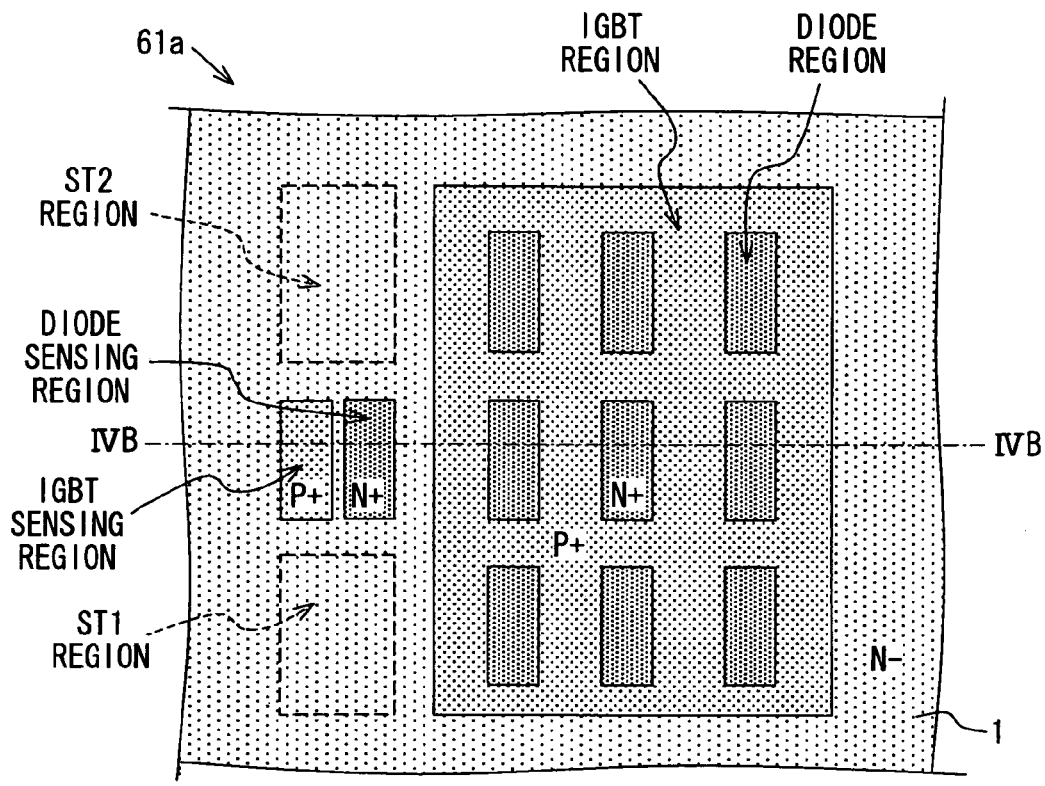
FIG. 4A is a diagram illustrating a bottom view of a semiconductor device as a first example of the semiconductor device of FIG. 2.
Figure 4B:
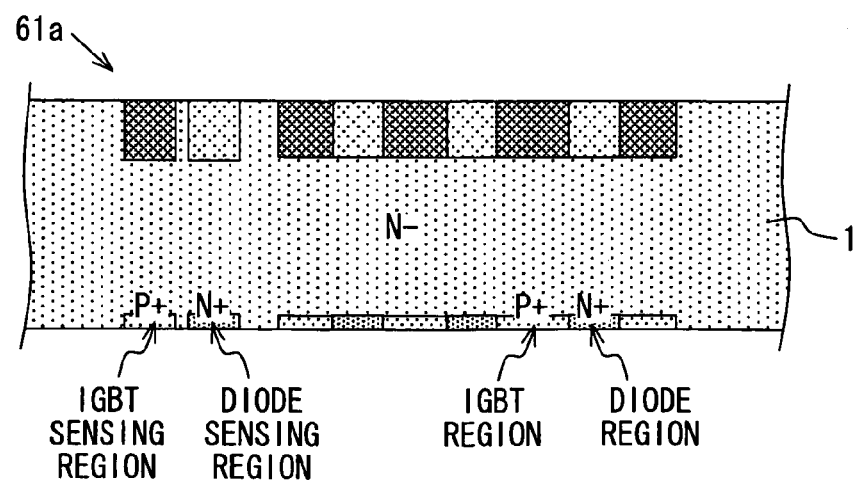
FIG. 4B is a diagram illustrating a cross-sectional view taken along line IVB-IVB of FIG. 4A.
Figure 5:
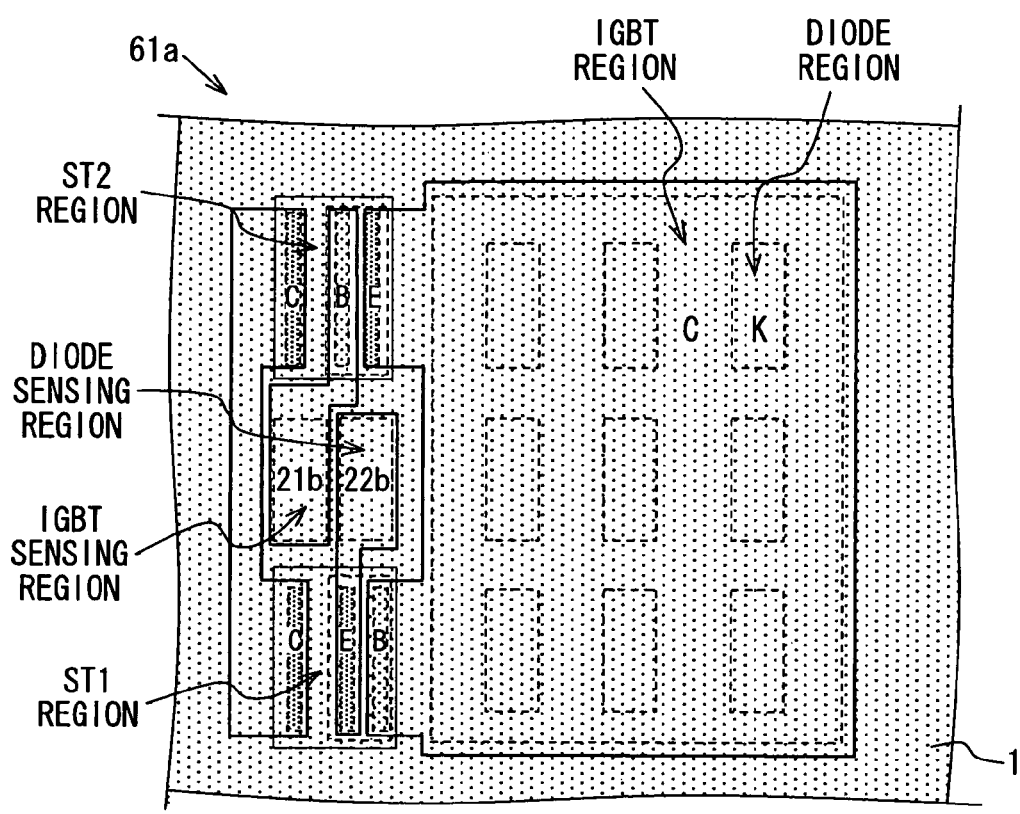
FIG. 5 is a diagram illustrating a top view of the semiconductor device of FIG. 4A.

FIGS. 4A-5 illustrate a schematic structure of a semiconductor device 61a as a first example of the semiconductor device 61. FIG. 4A is a diagram illustrating a bottom view of the semiconductor device 61a. FIG. 4B is a diagram illustrating a cross-sectional view taken along line IV-IV of FIG. 4A. FIG. 5 is a diagram illustrating a top view of the semiconductor device 61a.

The semiconductor device 61a has first portion and second portion. An IGBT region and a diode region are formed in the first portion. An IGBT sensing region, a diode sensing region, a control transistor ST1 region, and a control transistor ST2 region are formed in the second portion. In the semiconductor device 61a, the first portion is located on the right side of FIG. 4A, and the second portion is located on the left side of FIG. 4A. The second portion is located adjacent to the IGBT region to improve responsivity by reducing the wiring length. A cross-sectional structure of the semiconductor device 61a is shown in FIG. 4B. For example, the semiconductor device 61a can have the same cross-sectional structure as the semiconductor device 100 shown in FIG. 19. In FIG. 5, a heavy line represents a wiring pattern on a top side of the semiconductor device 61a. The same reference numbers and characters are used in FIGS. 2 and 5 to refer to the same or like elements.

Figure 6A:
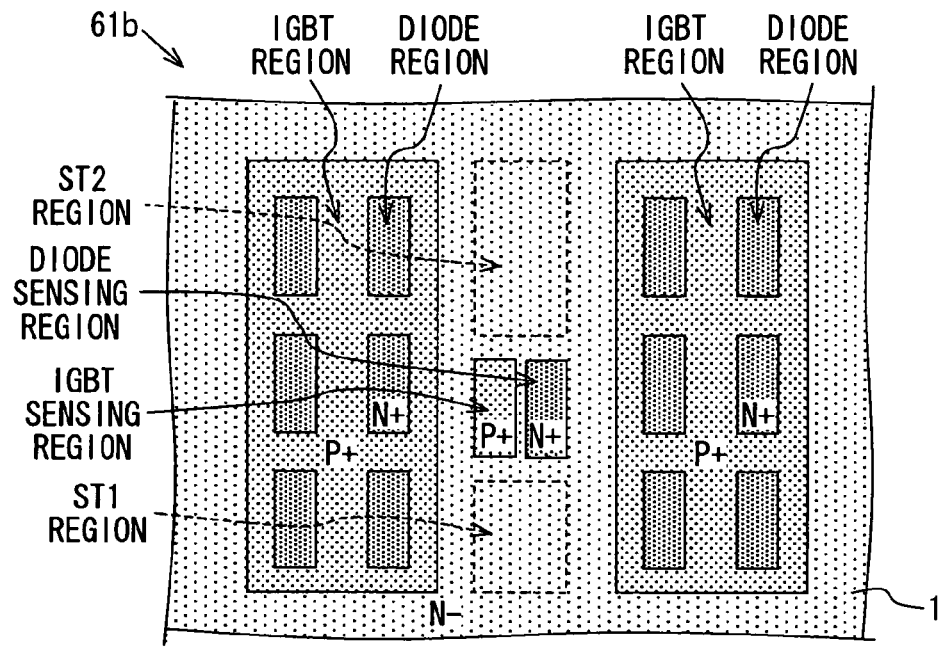
FIG. 6A is a diagram illustrating a bottom view of a semiconductor device as a second example of the semiconductor device of FIG. 2.

FIG. 6A illustrates a schematic structure of a semiconductor device 61b as a second example of the semiconductor device 61. In the semiconductor device 61b, the first portion where the IGBT region and the diode region are formed is divided into two parts, and the two parts of the first portion are separated from each other by the second portion where the IGBT sensing region, the diode sensing region, the control transistor ST1 region, and the control transistor ST2 region are formed.

Figure 6B:
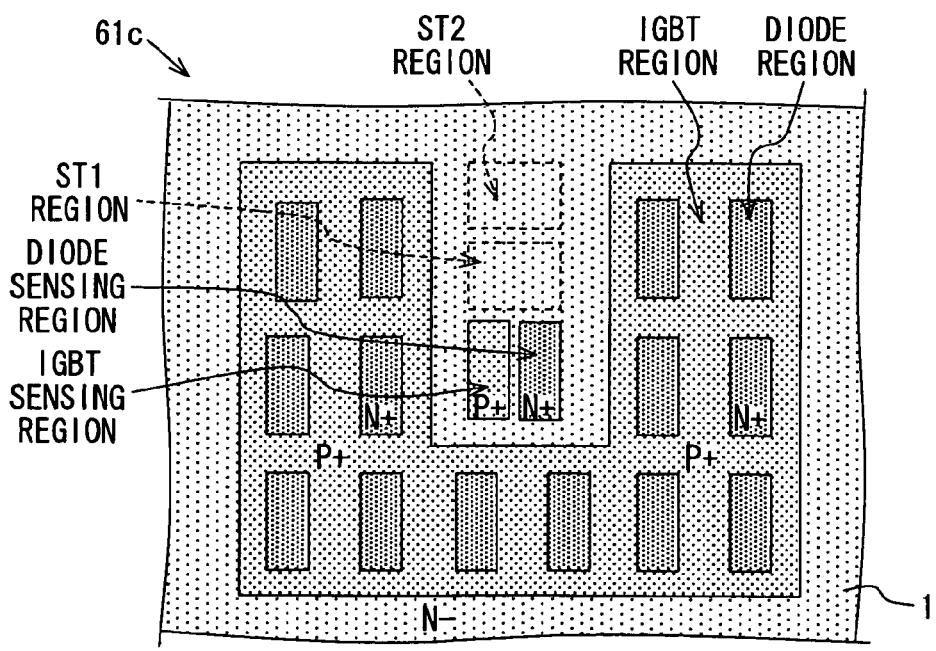
FIG. 6B is a diagram illustrating a bottom view of a semiconductor device as a third example of the semiconductor device of FIG. 2.
Figure 7:
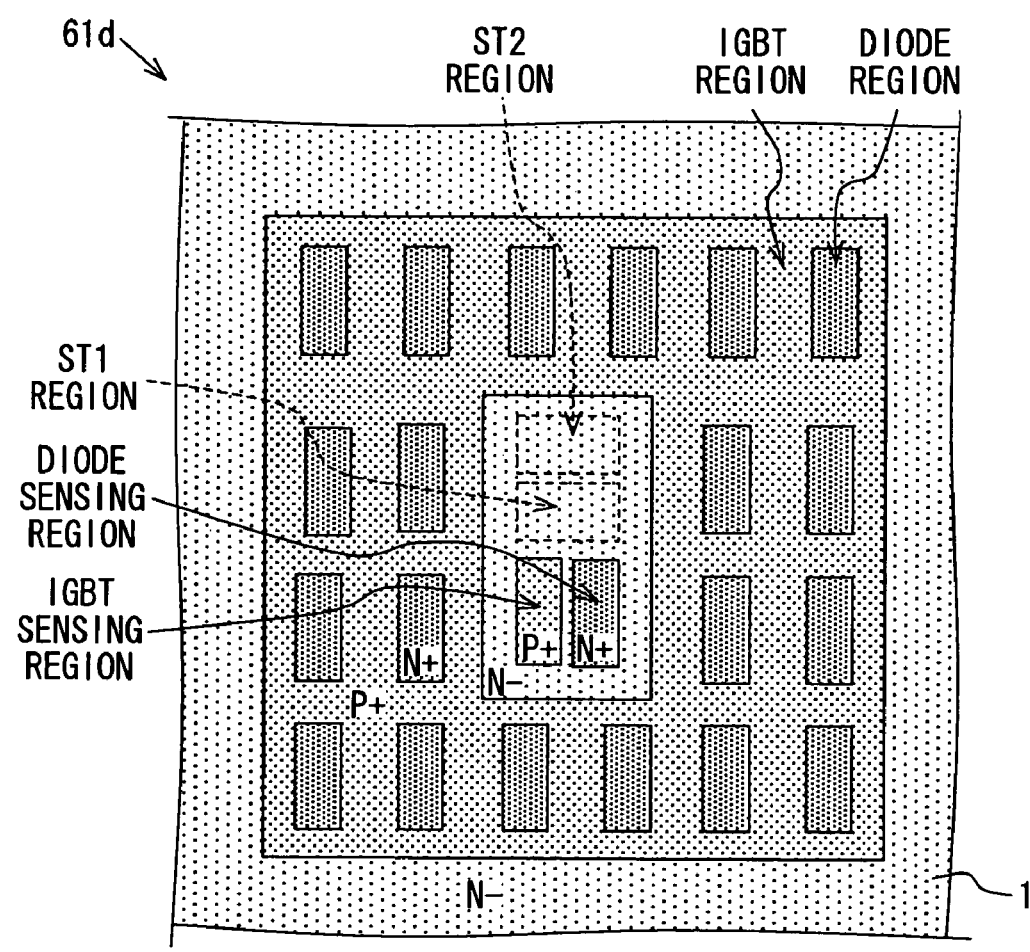
FIG. 7 is a diagram illustrating a bottom view of a semiconductor device as a fourth example of the semiconductor device of FIG. 2.

FIG. 6B illustrates a schematic structure of a semiconductor device 61c as a third example of the semiconductor device 61. In the semiconductor device 61c, the first portion is arranged in a C-shape having an inner space, and the second portion is located in the inner space of the C-shaped first portion.

FIG. 6C illustrates a schematic structure of a semiconductor device 61d as a fourth example of the semiconductor device 61. In the semiconductor device 61d, the first portion is arranged in a rectangular ring shape having an enclosed inner space, and the second portion is located in the enclosed inner space of the ring-shaped first portion.

In each of the semiconductor devices 61b-61d, the second portion is located adjacent to the IGBT region to improve responsivity by reducing the wiring length.

Examples of a structure of the bipolar transistor ST1 of the semiconductor device 61 shown in FIG. 2 are described below with reference to FIGS. 8A-8C. Although not shown in the drawings, the bipolar transistors ST2, ST3 can have a similar structure to the bipolar transistor ST1.

Figure 8A:
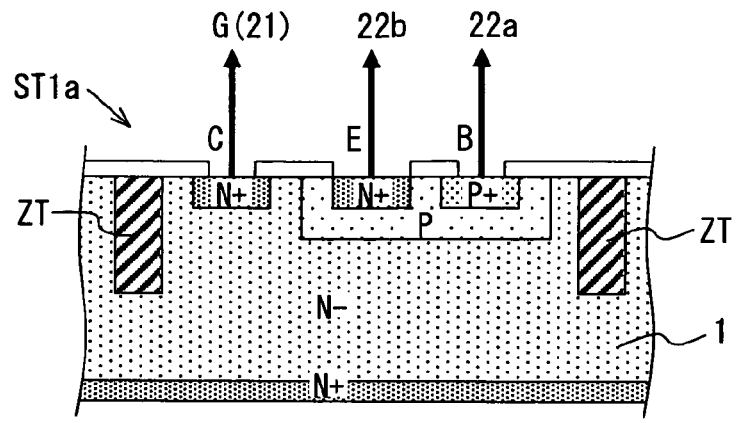
FIG. 8A is a diagram illustrating a structure of a bipolar transistor used in the semiconductor device of FIG. 2.

FIG. 8A illustrates a schematic structure of a bipolar transistor ST1a as a first example of the bipolar transistor ST1. The bipolar transistor ST1a is surrounded by an insulating trench ZT formed in the semiconductor substrate 1. In such an approach, even when the bipolar transistor ST1a is located adjacent to the IGBT region and the diode region, a parasitic thyristor action can be prevented.

Figure 8B:
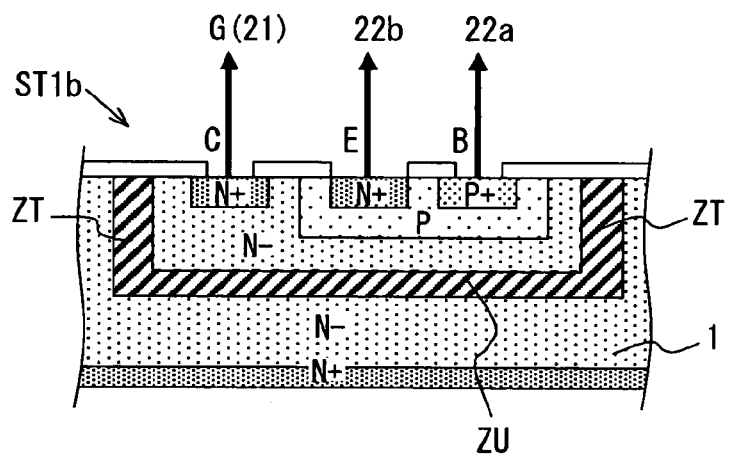
FIG. 8B is a diagram illustrating another structure of the bipolar transistor used in the semiconductor device of FIG. 2.

FIG. 8B illustrates a schematic structure of a bipolar transistor ST1b as a second example of the bipolar transistor ST1. The bipolar transistor ST1b is isolated by the insulating trench ZT and a buried insulating layer ZU. In such an approach, even when the bipolar transistor ST1b is located adjacent to the IGBT region and the diode region, a parasitic thyristor action can be prevented.

Figure 8C:
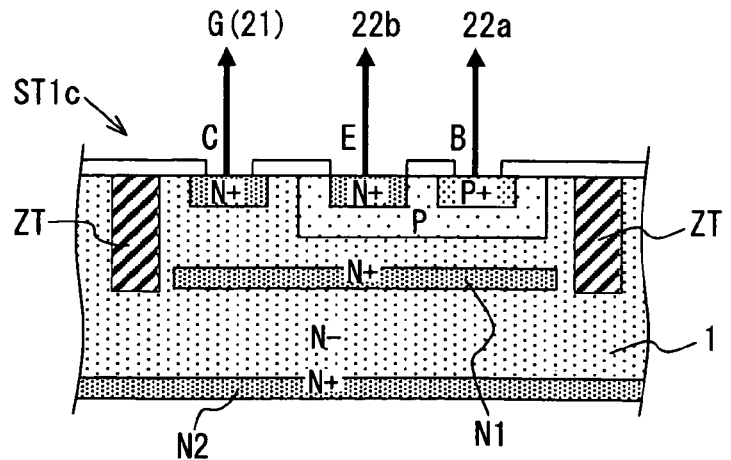
FIG. 8C is a diagram illustrating another structure of the bipolar transistor used in the semiconductor device of FIG. 2.

FIG. 8C illustrates a schematic structure of a bipolar transistor ST1c as a third example of the bipolar transistor ST1. The bipolar transistor ST1c is surrounded by the insulating trench ZT. Further, highly-doped layers N1, N2 are located directly below the bipolar transistor ST1c. Each of the highly-doped layers N1, N2 has the same conductivity type as the semiconductor substrate 1. But, each of the highly-doped layers N1, N2 has an impurity concentration higher than that of the semiconductor substrate 1. In such an approach, even when the bipolar transistor ST1c is located adjacent to the IGBT region and the diode region, a parasitic thyristor action can be prevented.

Figure 9:
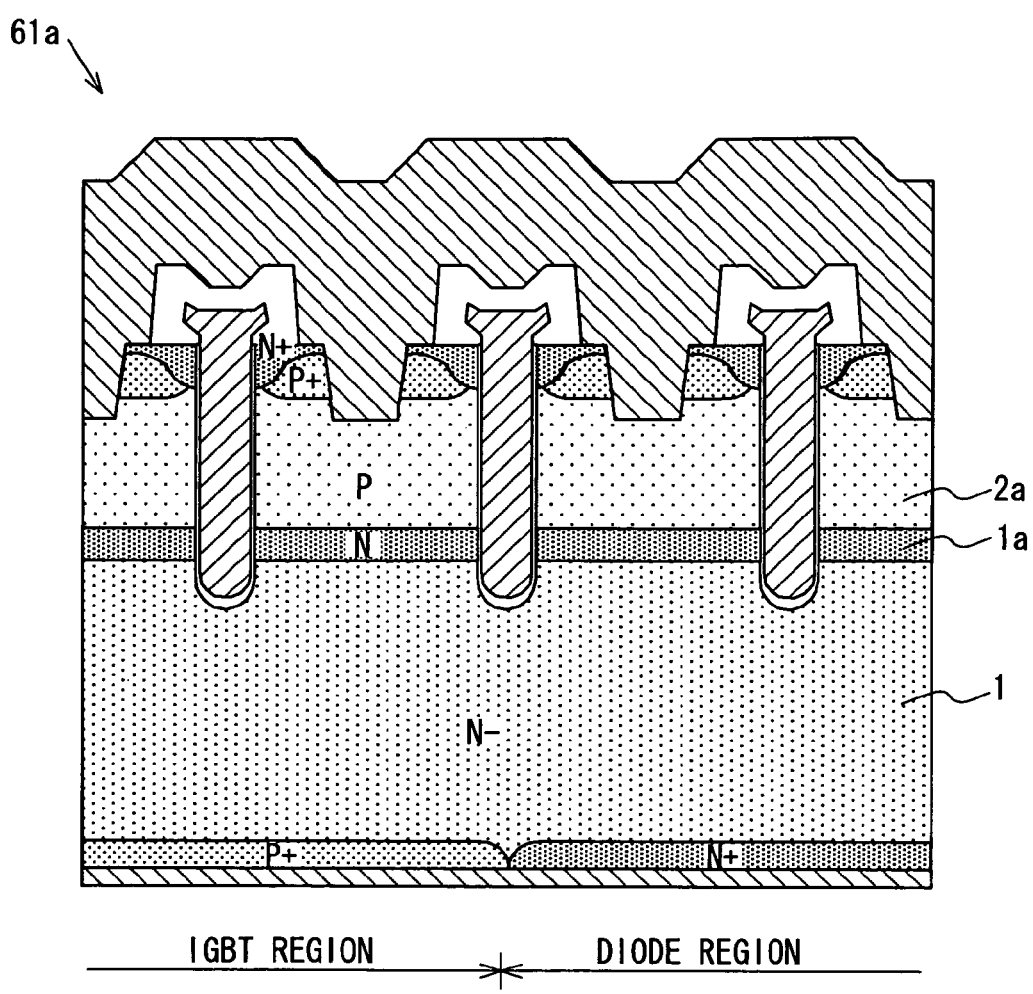
FIG. 9 is a diagram illustrating a partially-enlarged view of FIG. 4B.

FIG. 9 is a diagram illustrating a partially-enlarged view of FIG. 4B. As can be seen by comparing FIG. 9 and FIG. 19, a difference between the semiconductor devices 61a, 100 is in that the semiconductor device 61a has a highly-doped layer 1a located between a channel layer 2a and a drift layer of the IGBT. The highly-doped layer 1a has the same conductivity type as the semiconductor substrate 1. But, the highly-doped layer 1a has an impurity concentration higher than that of the semiconductor substrate 1. In such an approach, even when the bipolar transistors ST1, ST2 are located adjacent to the IGBT region and the diode region, a parasitic thyristor action can be prevented.

As described above, the semiconductor device according to the embodiments includes an insulated gate transistor and a diode that are formed in a common semiconductor substrate and coupled in an antiparallel configuration. The semiconductor device further includes a control transistor that can serve not only to prevent interference between the insulated gate transistor and the diode but also to protect the insulated gate transistor from the excessive current. Since the control transistor is located adjacent to the insulated gate transistor or the diode, the control transistor can operate at high speed to handle the instantaneous large currents (excessive current). Further, since the control transistor has a simple structure and a small size, the semiconductor device can be reduced in size accordingly.

In view of the above, the semiconductor device according to the embodiments can be suitably applied to an inverter circuit.

For example, the semiconductor devices 60, 61, 70 shown in FIGS. 1-3 can be applied to an inverter circuit in the following manner.

Figure 10:
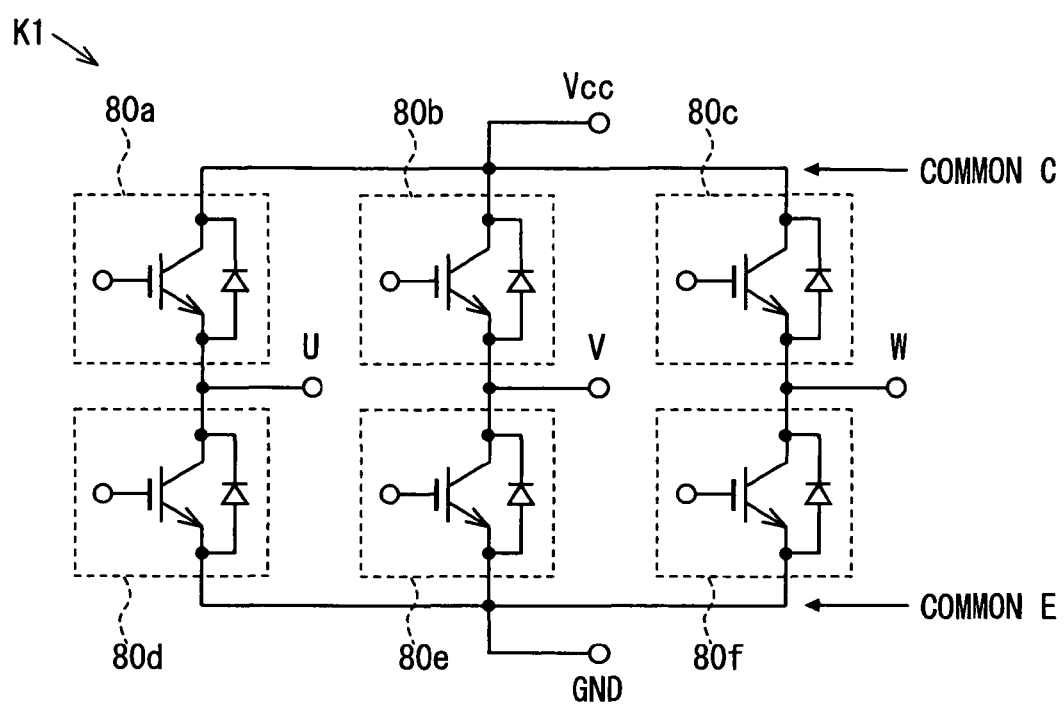
FIG. 10 is a circuit diagram illustrating an inverter circuit for producing three-phase alternating current power.

FIG. 10 illustrates an inverter circuit K1 for producing three-phase alternating current (AC) power. The inverter circuit K1 includes six semiconductor devices 80a-80f, each of which corresponds to any one of the semiconductor devices 60, 61, and 70. Although FIG. 10 depicts only the IGBT and the diode, each of the semiconductor devices 80a-80f has the same structure as any one of the semiconductor devices 60, 61, and 70. That is, each of the semiconductor devices 80a-80f has a control transistor corresponding to the control transistors ST1-ST3.

The semiconductor devices 80a-80c construct an upper half of the inverter circuit K1. The collector terminals of the IGBTs of the semiconductor devices 80a-80c are coupled together to a power supply potential Vcc. The semiconductor devices 80d-80f construct a lower half of the inverter circuit K1. The emitter terminals of the IGBTs of the semiconductor devices 80d-80f are coupled together to a ground potential GND. The emitter terminals of the IGBTs of the semiconductor devices 80a-80c are coupled to the collector terminals of the IGBTs of the semiconductor devices 80d-80f to provide three-phase AC power output terminals U, V, W, respectively. The three-phase AC power output terminals U, V, W of the inverter circuit K1 are coupled to an electric load such as a motor. In each of the semiconductor devices 80a-80f, the diode is coupled to the IGBT in an antiparallel configuration. Thus, the diode can serves as a freewheel diode.

Figure 11:
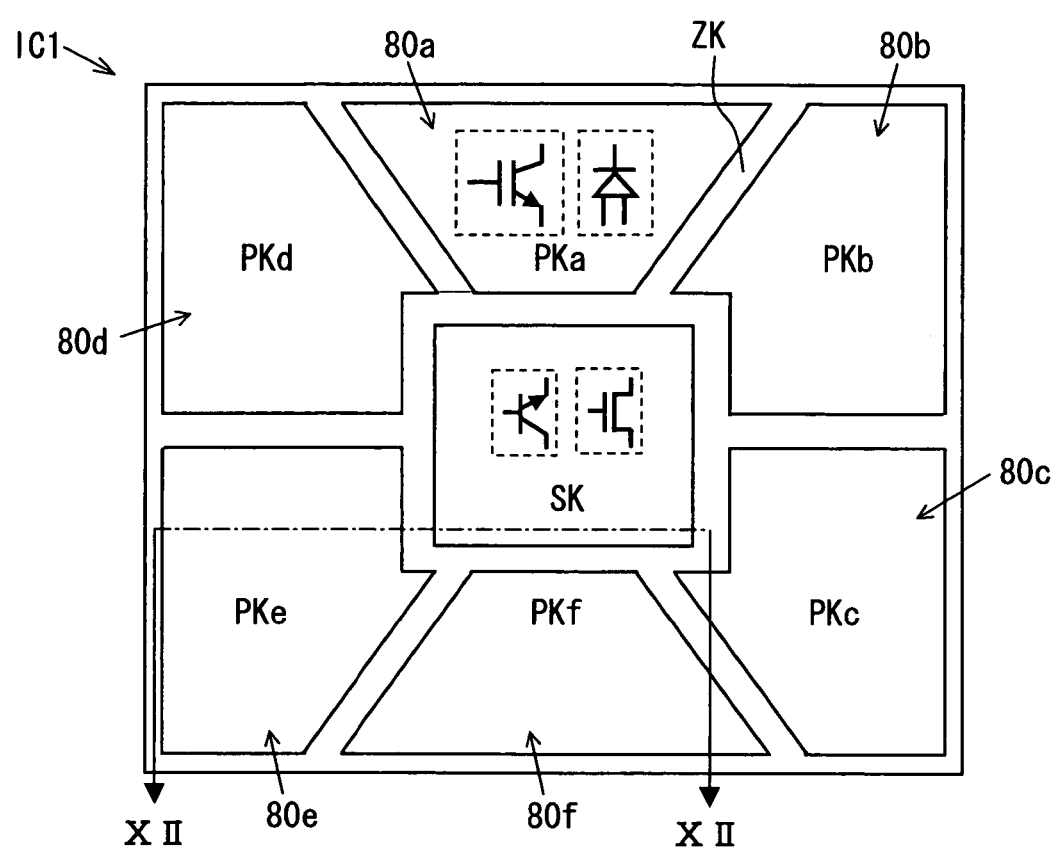
FIG. 11 is a diagram illustrating a top view of a semiconductor chip in which the inverter circuit of FIG. 10 is integrated.

The inverter circuit K1 can be integrated in a single semiconductor chip IC1 shown in FIG. 11. The semiconductor chip IC1 includes power regions PKa-PKf that are electrically isolated from each other by an insulating trench ZK that penetrates through a semiconductor substrate. The IGBT and the diode of the semiconductor device 80a are formed to the power region PKa. The IGBT and the diode of the semiconductor device 80b are formed to the power region PKb. The IGBT and the diode of the semiconductor device 80c are formed to the power region PKc. The IGBT and the diode of the semiconductor device 80d are formed to the power region PKd. The IGBT and the diode of the semiconductor device 80e are formed to the power region PKe. The IGBT and the diode of the semiconductor device 80f are formed to the power region PKf. Elements other than the IGBT and the diode of the semiconductor devices 80a-80f are collectively formed in a control region SK. As shown in FIG. 11, the control region SK is located in the center of the semiconductor chip IC1 and surrounded by the power regions PKa-PKf. For example, the control transistors, corresponding to the bipolar transistors ST1-ST3, of the semiconductor devices 80a-80f are collectively formed in the control region SK. Since the semiconductor devices 80a-80f are isolated from each other by the insulating trench ZK, the inverter circuit K1 can handle a large current. Further, since the inverter circuit K1 is integrated in a single semiconductor chip IC1, the inverter circuit K1 can be reduced in size.

Figure 12:
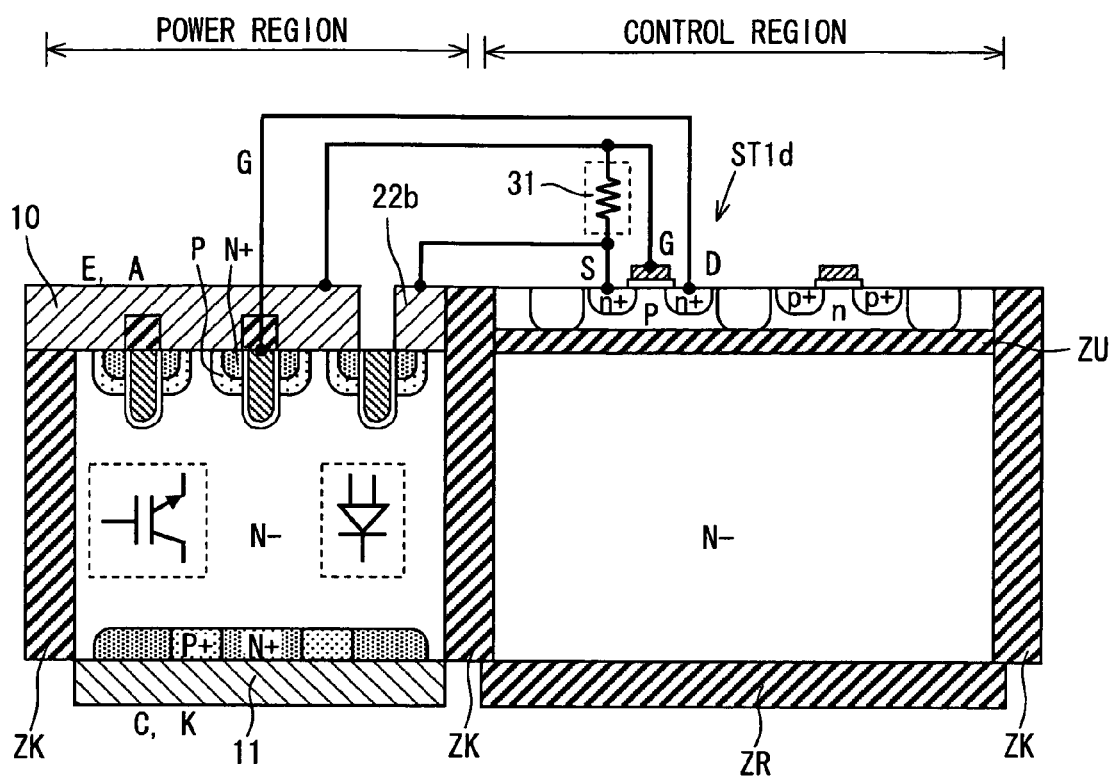
FIG. 12 is a diagram illustrating a cross-sectional view taken along line XII-XII of FIG. 11.

Specifically, as shown in FIG. 12, a vertical IGBT and a diode are integrally formed in the power region. The IGBT has emitter and gate terminals on a top side of the semiconductor chip IC1 and a collector terminal on a back side of the semiconductor chip IC1. The emitter and gate terminals of the IGBT are electrically coupled to outside through a conductive film 10 such as an aluminum film. The collector terminal of the IGBT is electrically coupled to outside through a conductive film 11 such as an aluminum film.

Further, as shown in FIG. 12, a MOS transistor ST1d (i.e., lateral transistor) as a control transistor is formed in the control region SK. The MOS transistor ST1d is formed in a SOI layer on a buried insulating layer ZU. A back side of the control region SK is protected by an insulating film ZR.

For example, the control transistor, the IGBT, and the diode can be electrically coupled to each other as indicated by a heavy line in FIG. 12. A resistance of a resistor 31 can range from several tens of ohms to several kilo ohms. The resistor 31 corresponds to the first sensing resistor 31 of FIG. 1. The resistor 31 can be a thin film resistor, a diffused resistor, a polysilicon resistor, or the like. The resistor 31 can be formed to the control region SK or the power regions PKa-PKf. The MOS transistor ST1d has a drain terminal D (n+), a gate terminal G, and a source terminal S (n+).

When a NPN transistor is used instead of the MOS transistor ST1d, collector, base, and emitter terminals of the NPN transistor correspond to the drain, gate, and the source terminals D, G, S, respectively. In this case, as shown in FIG. 1, the collector terminal of the NPN transistor is coupled to the gate terminal of the IGBT 21, the base terminal of the NPN transistor is coupled to the emitter terminal of the IGBT 21, and the emitter terminal of the NPN transistor is coupled to each of the resistor 31 and the sensing anode terminal 22b of the diode 22.

As shown in FIG. 12, the power regions PKa-PKf are electrically isolated from each other by the insulating trench ZK. Further, each of the power regions PKa-PKf is isolated from the control region SK by the insulating trench ZK. When the semiconductor chip IC1 is used in a hybrid electric vehicle, a voltage of about 1200 volts can be applied between the IGBTs located in adjacent power regions PKa-PKf. A resistance to the voltage application can be improved by increasing the number and the thickness of the insulating trench ZK. For example, the insulating trench ZK can be multilayered to improve the resistance to the voltage application.

Figure 13A:
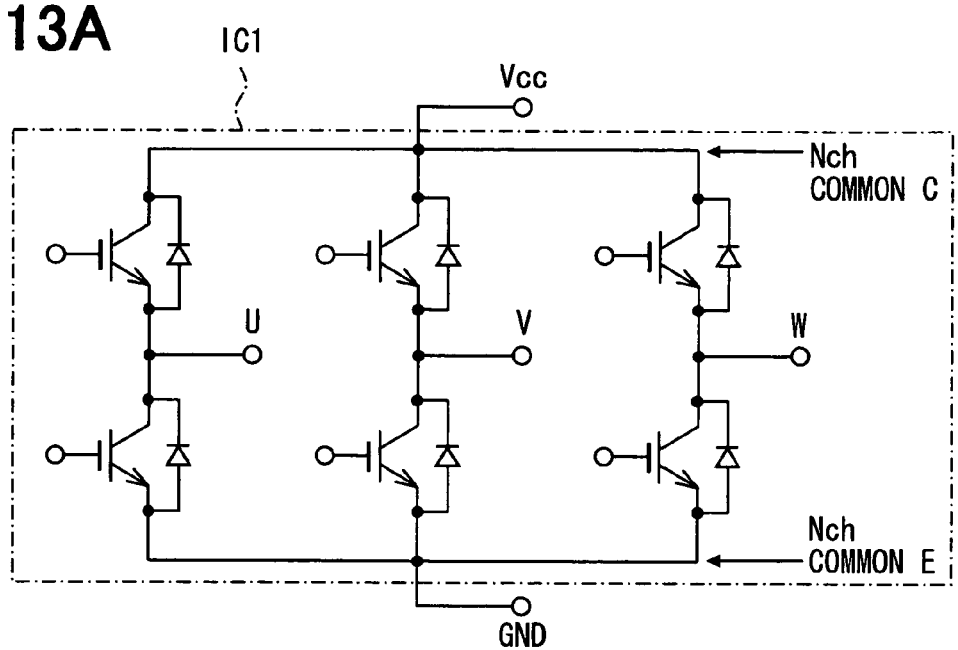
FIG. 13A is a circuit diagram of the inverter circuit integrated in the semiconductor chip of FIG. 11 and shows a terminal layout of the semiconductor chip of FIG. 11.
Figure 13B:
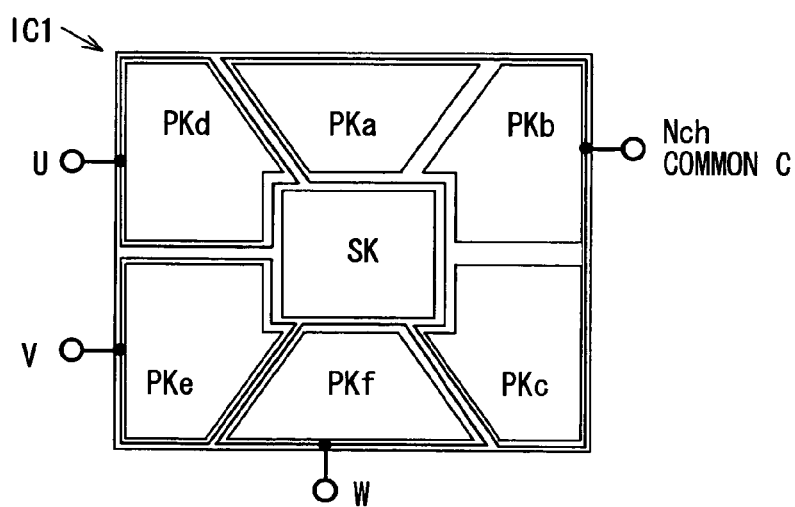
FIG. 13B is a diagram illustrating a bottom view of the semiconductor chip of FIG. 11 and showing the terminal layout.
Figure 13C:
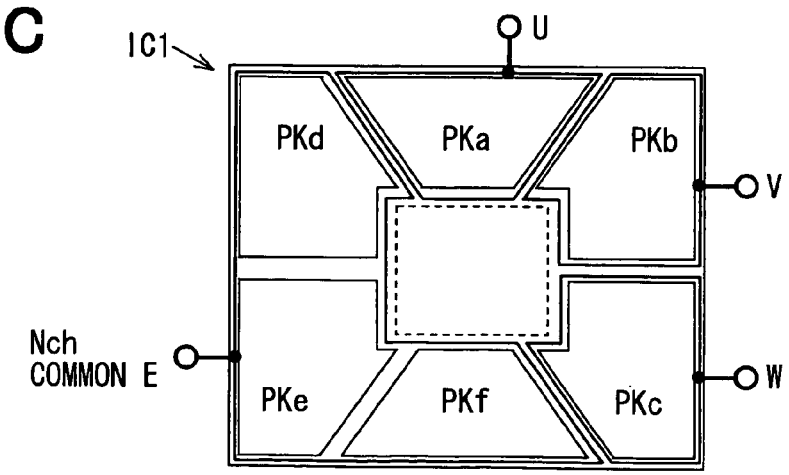
FIG. 13C is a diagram illustrating a top view of the semiconductor chip of FIG. 11 and showing the terminal layout.

FIGS. 13A-13C illustrate a terminal layout of the semiconductor IC1 shown in FIG. 11. FIG. 13A is a circuit diagram of the inverter circuit K1 integrated in the semiconductor chip IC1. FIG. 13B is a diagram illustrating a bottom view of the semiconductor chip IC1. FIG. 13C is a diagram illustrating a top view of the semiconductor chip IC1.

As shown in FIG. 13A, each IGBT used in the semiconductor chip IC1 is a N-channel IGBT. Therefore, as shown in FIG. 13B, the IGBTs formed in the power regions PKa-PKc, corresponding to the upper half of the inverter circuit K1, has a common collector terminal C. As shown in FIG. 13C, the IGBTs formed in the power regions PKd-PKf, corresponding to the lower half of the inverter circuit K1, has a common emitter terminal E. The common collector terminal C is coupled to the power supply potential Vcc, and the common emitter terminal E is coupled to the ground potential GND. The emitter terminals of the IGBTs formed in the power regions PKa-PKc are coupled to the collector terminals of the IGBTs formed in the power regions PKd-PKf to provide the three-phase output terminals U, V, W, respectively.

Figure 14A:
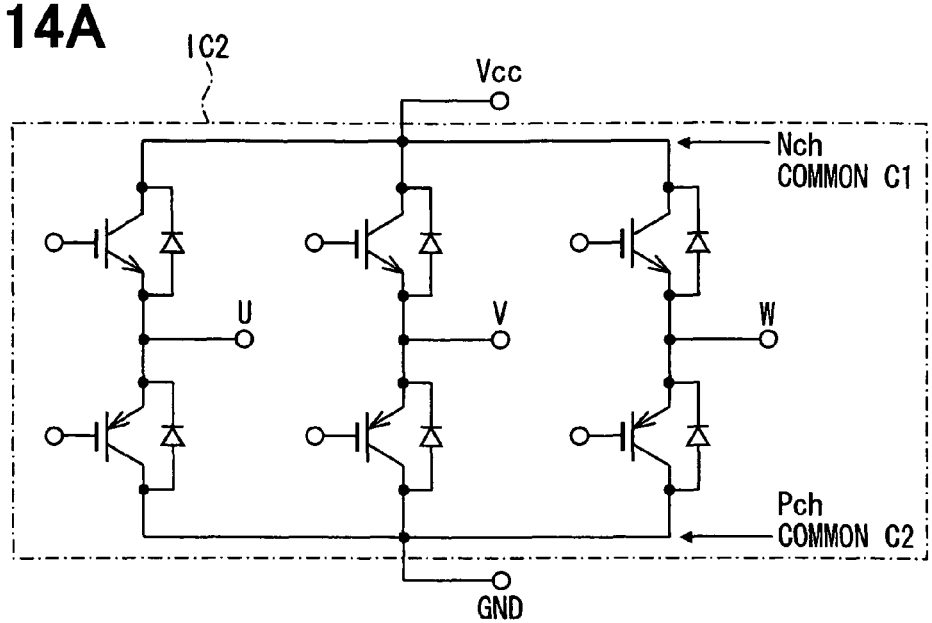
FIG. 14A is a circuit diagram of an inverter circuit integrated in another semiconductor chip and illustrates a terminal layout of the other semiconductor chip.
Figure 14B:
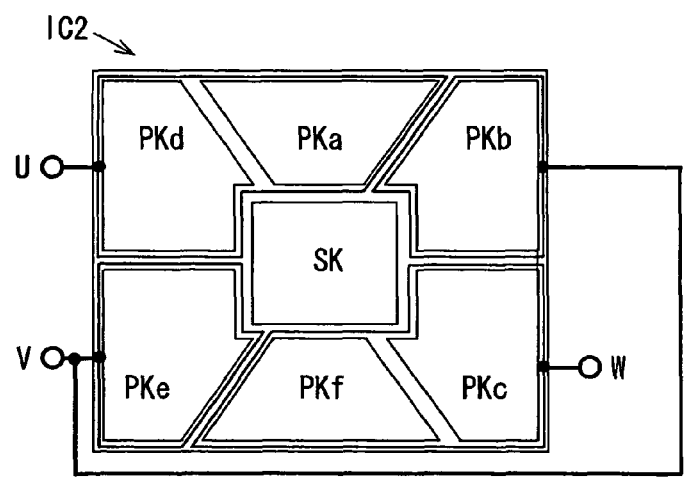
FIG. 14B is a diagram illustrating a bottom view of the other semiconductor chip and showing the terminal layout.
Figure 14C:
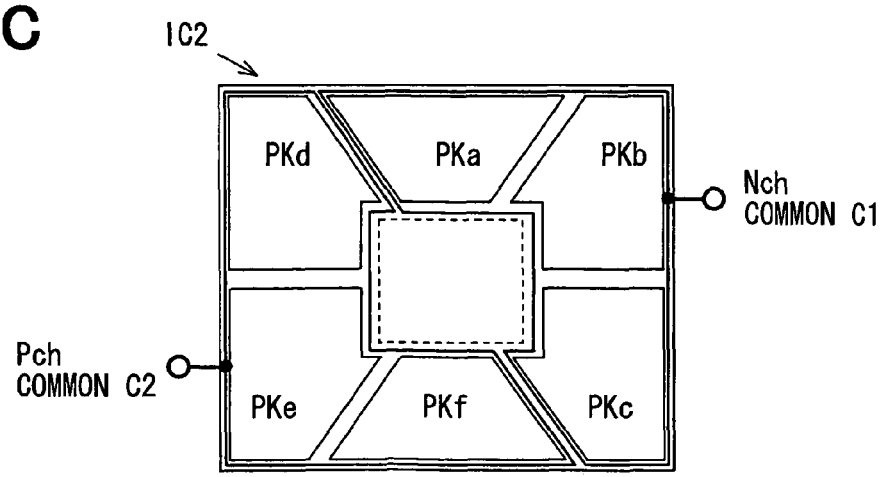
FIG. 14C is a diagram illustrating a top view of the other semiconductor chip and showing the terminal layout.

FIGS. 14A-14C illustrate a terminal layout of a semiconductor chip IC2. FIG. 14A illustrates a circuit diagram of an inverter circuit integrated in the semiconductor chip IC2. FIG. 14B illustrates a diagram illustrating a bottom view of the semiconductor chip IC2. FIG. 14C illustrates a diagram illustrating a top view of the semiconductor chip IC2.

As shown in FIG. 14A, in the semiconductor chip IC2, an upper half of the inverter circuit is constructed with N-channel IGBTs, and a lower half of the inverter circuit is constructed with P-channel IGBTs.

In the N-channel IGBT, a P-type body region and a N-type emitter region are formed to a top side of a N-type semiconductor layer, and a P-type collector region is formed to a back side of the N-type semiconductor layer by ion-implantation technique. Further, a N-type cathode region of a diode is formed to the back side of the N-type semiconductor layer.

In the P-channel IGBT, a N-type body region and a P-type emitter region are formed to a top side of a P-type semiconductor layer, and a N-type collector region is formed to a back side of the P-type semiconductor layer by ion-implantation technique. Further, a P-type anode region of a diode is formed to the back side of the P-type semiconductor layer.

Therefore, as shown in FIG. 14B, the IGBTs formed in the power regions PKa-PKc, corresponding to the upper half of the inverter circuit, has a common collector terminal C1. As shown in FIG. 14C, the IGBTs formed in the power regions PKd-PKf, corresponding to the lower half of the inverter circuit, has a common collector terminal C2. The common collector terminal C1 is coupled to the power supply potential Vcc, and the common collector terminal C2 is coupled to the ground potential GND. The emitter terminals of the IGBTs formed in the element regions PKa-PKc are coupled to the emitter terminals of the IGBTs formed in the element regions PKd-PKf to provide the three-phase output terminals U, V, W, respectively.

In the semiconductor chip IC1, six semiconductor devices are integrated in a single semiconductor chip to construct the inverter circuit K1 shown in FIG. 10.

Figure 15A:
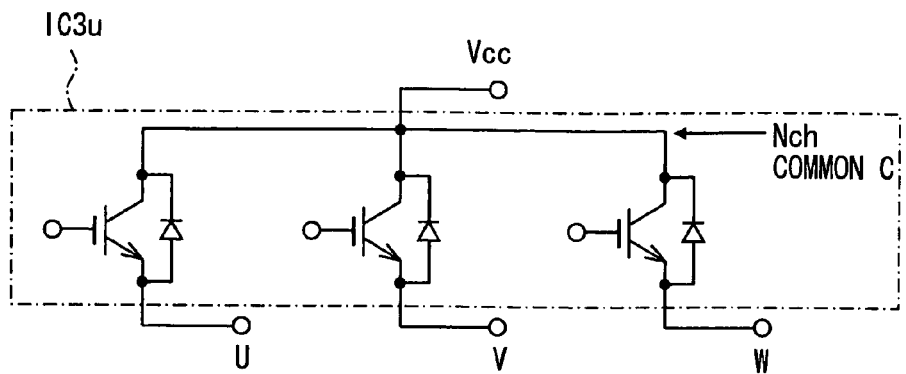
FIG. 15A is a circuit diagram of a semiconductor chip in which an upper half of the inverter circuit of FIG. 10 is integrated.
Figure 15B:
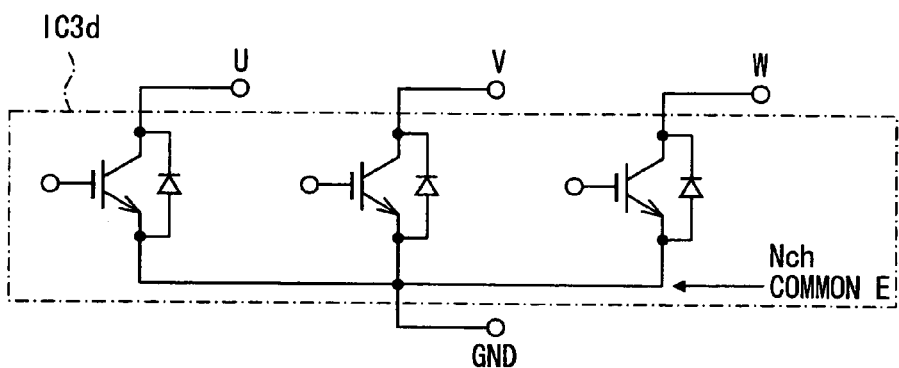
FIG. 15B is a circuit diagram of a semiconductor chip in which a lower half of the inverter circuit of FIG. 10 is integrated.

Alternatively, the inverter circuit K1 can be constructed with two semiconductor chips IC3u, IC3d shown in FIGS. 15A, 15B. Three semiconductor devices are integrated in each of the semiconductor chips IC3u, IC3d. The semiconductor chip IC3u constructs the upper half of the inverter circuit K1, and the semiconductor ship IC3d constructs the lower half of the inverter circuit K1.

Figure 16A:
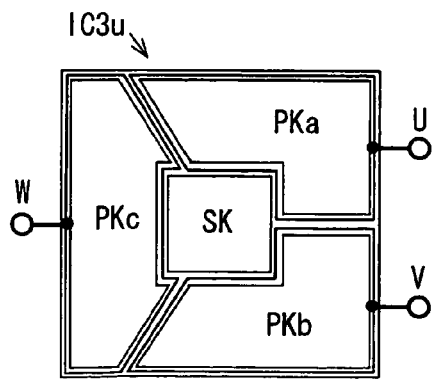
FIG. 16A is a diagram illustrating a top view of the semiconductor chip of FIG. 15A.
Figure 16B:
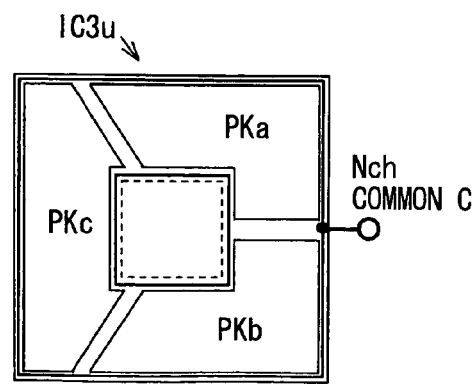
FIG. 16B is a diagram illustrating a bottom view of the semiconductor chip of FIG. 15A.
Figure 17A:
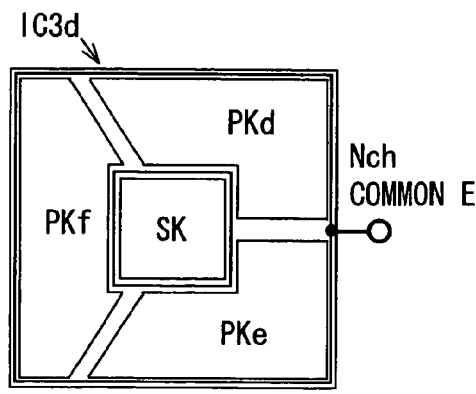
FIG. 17A is a diagram illustrating a top view of the semiconductor chip of FIG. 15B.
Figure 17B:
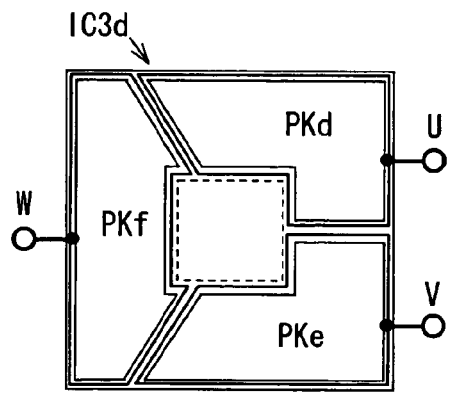
FIG. 17B is a diagram illustrating a bottom view of the semiconductor chip of FIG. 15B.
Figure 18A:
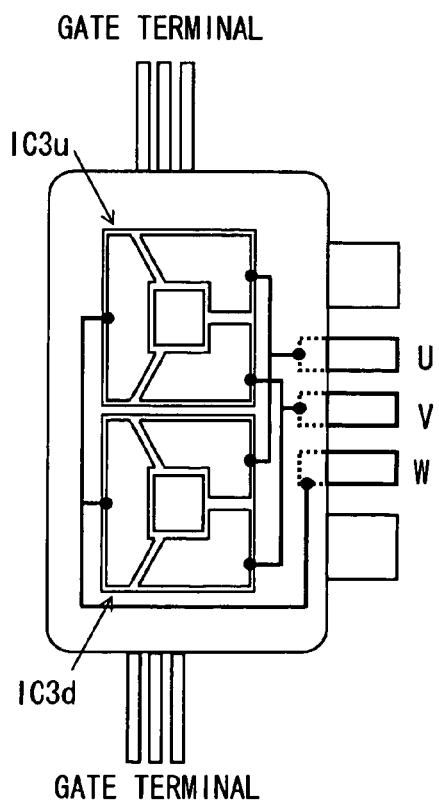
FIG. 18A is a diagram illustrating a top view of a package in which the semiconductor chips of FIGS. 15A, 15B are packaged together.
Figure 18B:
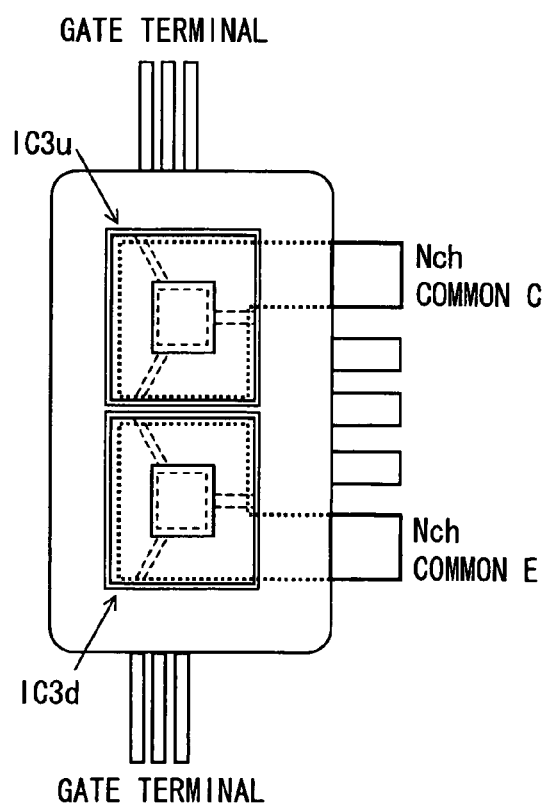
FIG. 18B is a diagram illustrating a bottom view of the package.

FIG. 15A illustrates a circuit diagram of the upper half of the inverter circuit K1 integrated in the semiconductor chip IC3u. FIG. 15B illustrates a circuit diagram of the lower half of the inverter circuit K1 integrated in the semiconductor chip IC3d. FIG. 16A is a diagram illustrating a top view of the semiconductor chip IC3u. FIG. 16B is a diagram illustrating a bottom view of the semiconductor chip IC3u. FIG. 17A is a diagram illustrating a top view of the semiconductor chip IC3d. FIG. 17B is a diagram illustrating a bottom view of the semiconductor chip IC3d. FIG. 18A is a diagram illustrating a top view of a package in which the semiconductor chips IC3u, IC3d are packaged together. FIG. 18B is a diagram illustrating a bottom view of the package.

In this way, the inverter circuit K1 can be constructed with two semiconductor chips IC3u, IC3d that are packaged together as shown in FIGS. 18A, 18B. Thus, the inverter circuit K1 can be reduced in size and manufactured at low cost.

As described above, the semiconductor device according to the embodiments can reliably operate and have a small size. Therefore, for example, the semiconductor device can be suitably applied to a device mounted on a vehicle.

Such changes and modifications are to be understood as being within the scope of the present invention as defined by the appended claims.

What is claimed is:
1. A semiconductor device comprising:
a semiconductor substrate;
an insulated gate transistor formed to the semiconductor substrate;

a diode formed to the semiconductor substrate;
a first control transistor formed to the semiconductor substrate; and
a first sensing resistor formed to the semiconductor substrate,
wherein a first current terminal of the insulated gate transistor is coupled to a cathode of the diode at a high potential side,
wherein a second current terminal of the insulated gate transistor is coupled to an anode of the diode at a low potential side,
wherein the first control transistor is configured to turn off the insulated gate transistor by reducing a potential of a gate terminal of the insulated gate transistor when the diode conducts a first electric current,
wherein the diode has a sensing anode terminal for outputting a second electric current proportional to the first electric current,
wherein the first sensing resistor is coupled between the anode and the sensing anode terminal of the diode,
wherein a control terminal of the first control transistor is coupled to the anode of the diode,
wherein the first current terminal of the first control transistor is coupled to the gate terminal of the insulated gate transistor, and
wherein the second current terminal of the first control transistor is coupled to the sensing anode terminal of the diode.

2. The semiconductor device according to claim 1, further comprising:
a second control transistor formed to the semiconductor substrate; and
a second sensing resistor formed to the semiconductor substrate,
wherein the second control transistor is configured to turn off the insulated gate transistor by reducing the potential of the gate terminal of the insulated gate transistor when a third electric current flowing through the insulated gate transistor exceeds an allowable current value,
wherein the insulated gate transistor has a sensing current terminal for outputting a fourth electric current proportional to the third electric current,
wherein the second sensing resistor is coupled between the sensing current terminal of the insulated gate transistor and the second current terminal of the insulated gate transistor,
wherein a control terminal of the second control transistor is coupled to the sensing current terminal of the insulated gate transistor,
wherein a first current terminal of the second control transistor is coupled to the gate terminal of the insulated gate transistor, and
wherein a second current terminal of the second control transistor is coupled to the second current terminal of the insulated gate transistor.

3. The semiconductor device according to claim 2,
wherein the second control transistor is a bipolar transistor or a metal-oxide-semiconductor transistor,
wherein the control terminal of the second control transistor is a base terminal of the bipolar transistor or a gate terminal of the metal-oxide-semiconductor transistor,
wherein the first current terminal of the second control transistor is a collector terminal of the bipolar transistor or a drain terminal of the metal-oxide-semiconductor transistor, and
wherein the second current terminal of the second control transistor is an emitter terminal of the bipolar transistor or a source terminal of the metal-oxide-semiconductor transistor.

4. The semiconductor device according to claim 2,
wherein the second control transistor is located adjacent to the insulated gate transistor or the diode.

5. The semiconductor device according to claim 1,
wherein the insulated gate transistor is an insulated gate bipolar transistor or a vertical metal-oxide-semiconductor transistor,
wherein the first current terminal of the insulated gate transistor is a collector terminal of the insulated gate bipolar transistor or a drain terminal of the vertical metal-oxide-semiconductor transistor, and
wherein the second current terminal of the insulated gate transistor is an emitter terminal of the insulated gate bipolar transistor or a source terminal of the vertical metal-oxide-semiconductor transistor.

6. The semiconductor device according to claim 1,
wherein the first control transistor is a bipolar transistor or a metal-oxide-semiconductor,
wherein the control terminal of the first control transistor is a base terminal of the bipolar transistor or a gate terminal of the metal-oxide-semiconductor transistor,
wherein the first current terminal of the first control transistor is a collector terminal of the bipolar transistor or a drain terminal of the metal-oxide-semiconductor transistor, and
wherein the second current terminal of the first control transistor is an emitter terminal of the bipolar transistor or a source terminal of the metal-oxide-semiconductor transistor.

7. The semiconductor device according to claim 1,
wherein the first control transistor is located adjacent to the insulated gate transistor or the diode.

8. The semiconductor device according to claim 1, further comprising:
an insulating trench formed to the semiconductor substrate,
wherein the first control transistor is surrounded by the insulating trench.

9. The semiconductor device according to claim 1, further comprising:
an insulating trench formed to the semiconductor substrate; and
a buried insulating layer formed to the semiconductor substrate,
wherein the first control transistor is isolated by the insulating trench and the buried insulating layer.

10. The semiconductor device according to claim 1, further comprising:
a first highly-doped layer formed to the semiconductor substrate and located directly below the first control transistor,
wherein the first highly-doped layer has the same conductivity type as the semiconductor substrate and has an impurity concentration greater than that of the semiconductor substrate.

11. The semiconductor device according to claim 1, further comprising:
a second highly-doped layer formed to the semiconductor substrate,
wherein the second highly-doped layer has the same conductivity type as the semiconductor substrate and has an impurity concentration greater than that of the semiconductor substrate, wherein the insulated gate transistor has a trench gate structure, and
wherein the second highly-doped layer is located between a channel layer and a drift layer of the insulated gate transistor.

12. The semiconductor device according to claim 1, wherein the semiconductor device is mounted on a vehicle.

13. An inverter circuit comprising:
a plurality of semiconductor devices, each of which is defined in claim 1.

14. The inverter circuit according to claim 13,
wherein the plurality of semiconductor devices comprises six semiconductor devices and is configured to generate a three-phase alternating current output, and
wherein the six semiconductor devices are integrated in a single semiconductor chip.

15. The inverter circuit according to claim 13,
wherein the plurality of semiconductor devices comprises six semiconductor devices and is configured to generate a three-phase alternating current output,
wherein three of the six semiconductor devices are integrated in a first single semiconductor chip, and
wherein another three of the six semiconductor devices are integrated in a second single semiconductor chip.

16. The inverter circuit according to claim 13,
wherein each of the insulated gate transistor and the diode of each of the plurality of semiconductor devices is a vertical element in which an electric current flows in a direction normal to a surface of the semiconductor substrate, and
wherein the plurality of semiconductor devices is isolated from each other by an insulating trench that penetrates through the semiconductor substrate in the direction.

* * * * *